United States Patent [19]

Jackson et al.

[11] Patent Number: 5,048,664

[45] Date of Patent: Sep. 17, 1991

[54] RECIPROCATING STAGING FIXTURE

[75] Inventors: Timothy L. Jackson; Ronald M. Gines, both of Boise, Id.

[73] Assignee: Micron Technology, Inc., Boise, Id.

[21] Appl. No.: 478,905

[22] Filed: Feb. 12, 1990

[51] Int. Cl.⁵ .............................................. B65G 43/00
[52] U.S. Cl. .................... 198/340; 198/345.1; 198/464.2; 198/468.8
[58] Field of Search ................. 198/340, 345.1, 463.4, 198/464.2, 468.8

[56] References Cited

U.S. PATENT DOCUMENTS

| | | | |
|---|---|---|---|
| 4,494,298 | 1/1985 | Matsuura et al. | 198/340 X |
| 4,607,338 | 8/1986 | Kitagawa | 198/340 X |
| 4,654,227 | 3/1987 | Cornellier . | |
| 4,682,682 | 7/1987 | Hartlepp | 198/463.4 |
| 4,741,429 | 5/1988 | Hattori et al. | 198/345.1 X |
| 4,799,450 | 1/1989 | Cornellier . | |
| 4,826,421 | 5/1989 | Asano et al. | 198/345.1 X |
| 4,860,439 | 8/1989 | Riley | 198/345.1 X |

FOREIGN PATENT DOCUMENTS

| | | | |
|---|---|---|---|
| 0115515 | 9/1980 | Japan | 198/345.1 |
| 0185629 | 8/1987 | Japan | 198/345.1 |

*Primary Examiner*—D. Glenn Dayoan
*Attorney, Agent, or Firm*—Albert M. Crowder, Jr.

[57] ABSTRACT

A reciprocating staging fixture, to precisely stage an integrated circuit component in a lead tinning system. The staging fixture exactly positions components by capturing it on three sides. The fixture also retracts completely out of the way of overhead component grippers, which allows the use of a more positive gripping configuration.

5 Claims, 5 Drawing Sheets

RECIPROCATING STAGING FIXTURE

BACKGROUND OF THE INVENTION

1. Field of the Invention

The present invention relates to the staging of a workpiece, and more particularly to staging improvements in an apparatus for tinning electronic components.

2. Description of the Related Art

The tinning of electronic components comprises the step of applying a hot solder coating to metallic leads or contact points of the component package. This tinning of a component prior to its placement on a circuit board is known in the art and is considered necessary to providing reliable, high quality solder connections. In the normal manufacturing cycle, a component may be stored for a time before utilization. During this storage time, leads can become oxidized or otherwise subject to deleterious conditions, such that when the component is later placed on and soldered to a circuit board (normally through an automated soldering system), an oxidized lead may not solder properly, leading to a board fault or defect. Accordingly, many manufacturers have found it advisable to solder coat component leads prior to use, such that when the component is later placed on the printed circuit board, the solder "reflows" and a good solder connection is assured.

Different types of systems have been used for component tinning, such as described in U.S. Pat. Nos. 4,654,227 and 4,799,450, both by inventor Cornellier and assigned to Corfin Technologies, Inc. of Chambly, Canada (hereinafter referred to as "Corfin").

One particular problem encountered with such systems relates to surface mounted components, which generally have small, closely spaced leads and low package profiles. Typical of such surface mount components are those known as LCCs (leadless chip carriers) or PLCCs (plastic leaded chip carriers). These components frequently have leads extending from all four sides of a small rectangular body, thus creating problems for mechanical staging and grasping of the component.

For example, Corfin offers a PLCC Lead Tinning System (model DTS-330LL) having staging and grasping means not disclosed by the above cited patents, illustrated in FIG. 1. A component 10 slides onto staging platform 11 from location 9 and is stopped by restraint 12. When optical detector 13 senses component 10, restraint 12 is pulled back by cylinder 14 in the direction shown. Gripper 15, on a continuously moving conveyer belt, closes as it passes over component 10, picking it up.

This configuration has some difficulties. For example, when component 10 strikes restraint 12, it tends to bounce off of staging platform 11. Restraint 16 helps this somewhat, being extended by cylinder 17 during staging, and withdrawn during pickup. Also, when restraint 12 is withdrawn in anticipation of pickup, friction between it and component 10 tends to rotate component 10, horizontally misaligning it for subsequent pickup. Further, if staging platform 11 does not receive component 10, restraint 12 remains extended in case a component is about to be received, interfering with the overhead path of gripper 15. To compensate, gripper 15 must be adjusted high enough to not strike extended restraint 12, yet low enough to successfully grasp component 10. The result is inconsistent alignment and grasping of component 10, causing gripper 15 to drop component 10, and sometimes no pickup at all.

Precise staging of components is imperative to insure that the components are properly picked up and carried through the wave soldering process.

It is an object of the present invention to provide precise and consistent staging and grasping of an electronic component in automated tinning systems such as described above.

SUMMARY OF THE INVENTION

According to the invention, a reciprocating staging fixture is provided to accurately stage PLCCs for pickup by conveyor grippers on a Corfin PLCC Lead Tinning System DTS-330LL or equivalent. The staging fixture positions the components in exactly the same position every time by capturing it on three sides. The fixture also retracts completely out of the way, which allows the use of a more positive conveyor gripping configuration.

The staging means includes a vertically reciprocating staging fixture, having three sides. The fixture prevents a component from bouncing off of the staging platform, and provides consistent precise alignment.

When a staged component is not sensed, the reciprocating staging fixture does not retract, and a lockout prevents an overhead gripper from closing over the staging platform. The reciprocating staging fixture is narrow enough that the gripper fingers pass outside of it in such a case.

DETAILED DESCRIPTION OF THE PREFERRED EMBODIMENT

Figure 1A:
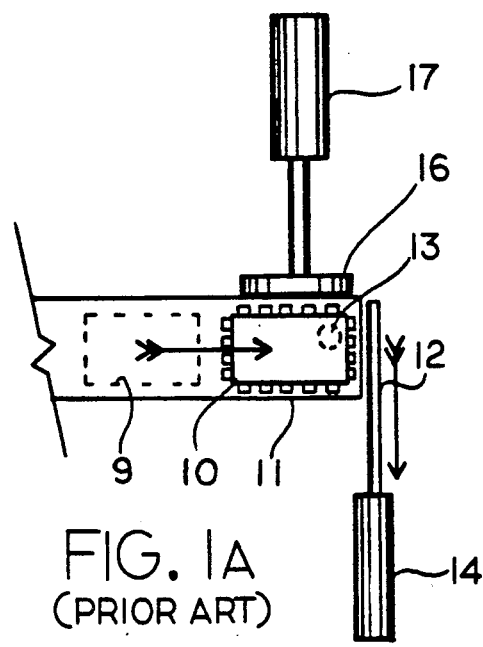
FIGS. 1a and 1b illustrate top and side views, respectively, of a prior art apparatus.
Figure 1B:
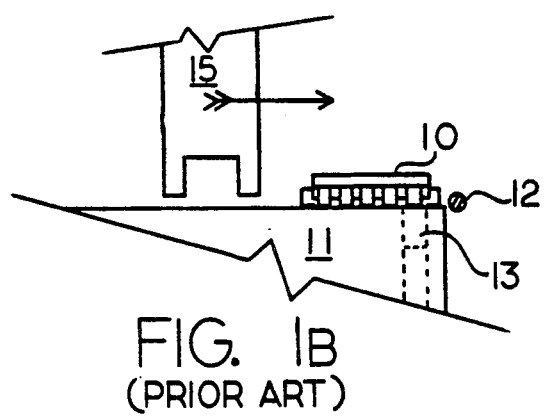
Figure 2A:
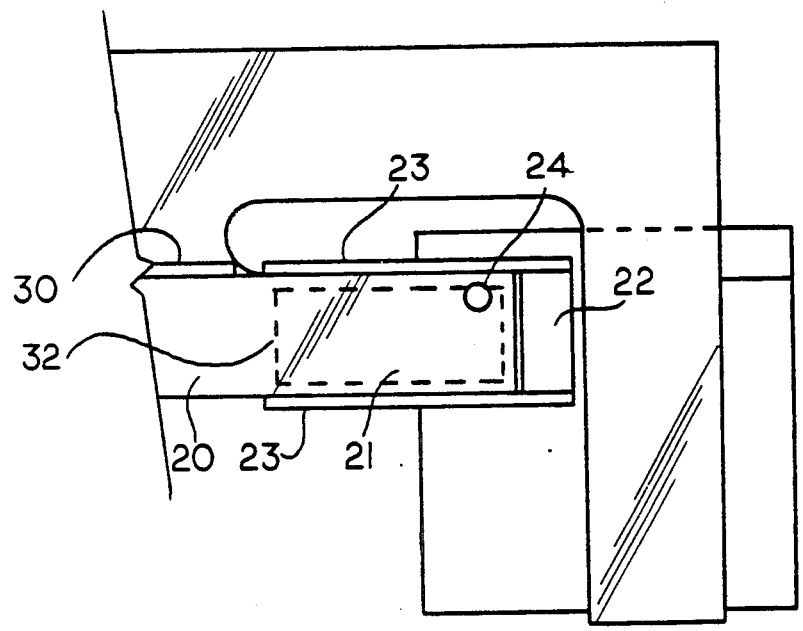
FIGS. 2a and 2b illustrate top and side views, respectively, of a preferred embodiment of the invention in an extended position.
Figure 2B:
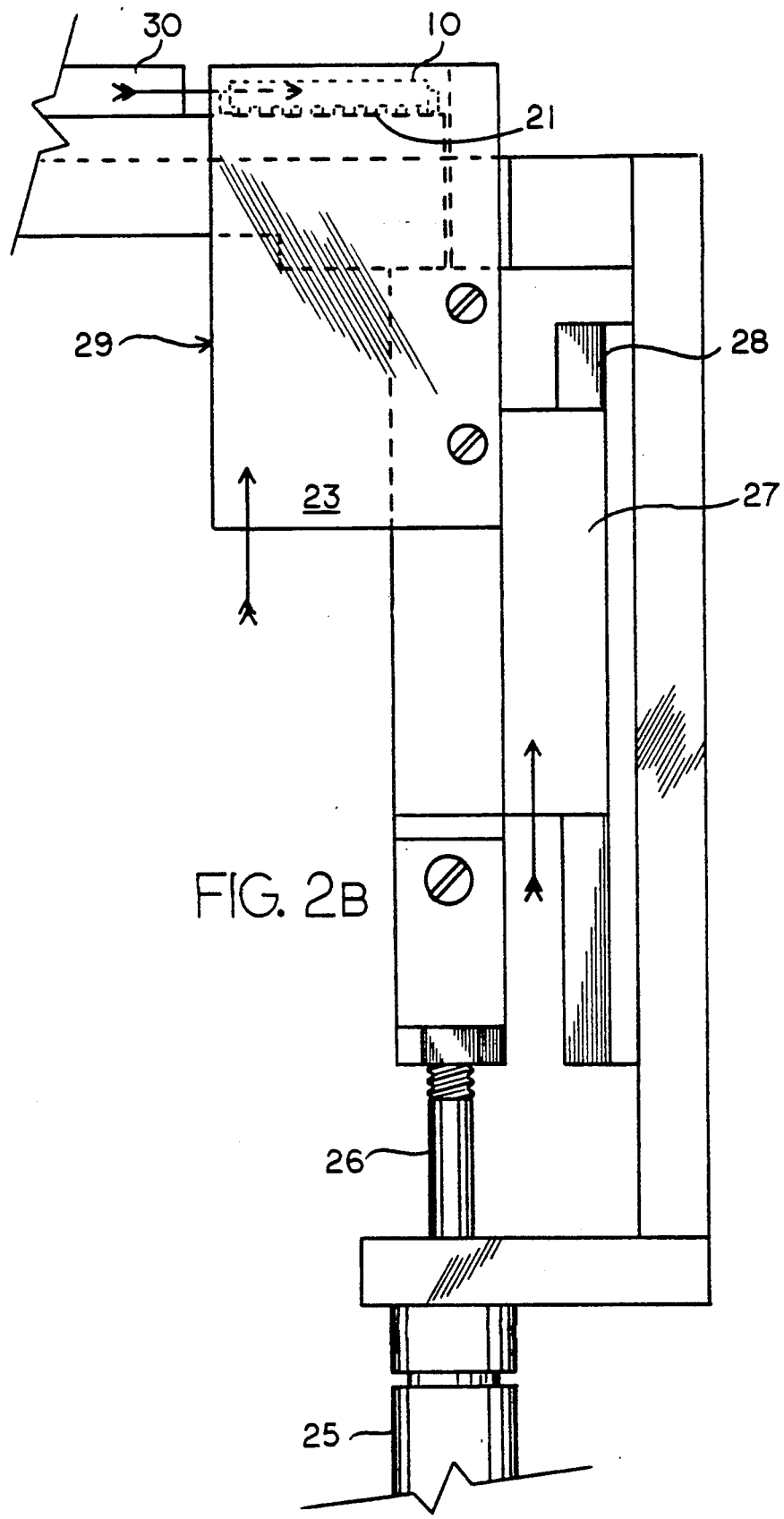

In a Corfin DTS-330LL PLCC Lead Tinning System, a slide input 20, staging platform 21 having a staging area 32, slide guide end restraint 22, side restraints 23, sensor 24 in the surface of staging platform 21, pneumatic cylinder 25, cylinder rod 26, linear bearing block 27, and linear bearing rail 28 are combined, as shown in FIGS. 2a and 2b, as a reciprocating staging fixture. Restraints 22 and 23 in combination form slide guide 29. Slide input 20 includes slide rail 30, which assists in keeping component 10 on slide input 20 as it slides.

Slide guide 29, cylinder rod 26, and linear bearing bock 27 are rigidly attached together, and reciprocate as one body up and down along linear bearing rail 28, according to the action of cylinder 25 on cylinder rod 26. Linear bearing rail 28, cylinder 25, staging platform 21, and slide input 20 are rigidly attached together as a fixed body.

In operation, when sensor 24 detects no component on staging platform 21, slide guide 29 is extended as shown in FIG. 2b. Component 10 slides via slide input 20 to staging platform 21. It is stopped by end restraint 22 and precisely positioned on staging platform 21 by restraints 22 and 23.

Figure 3:
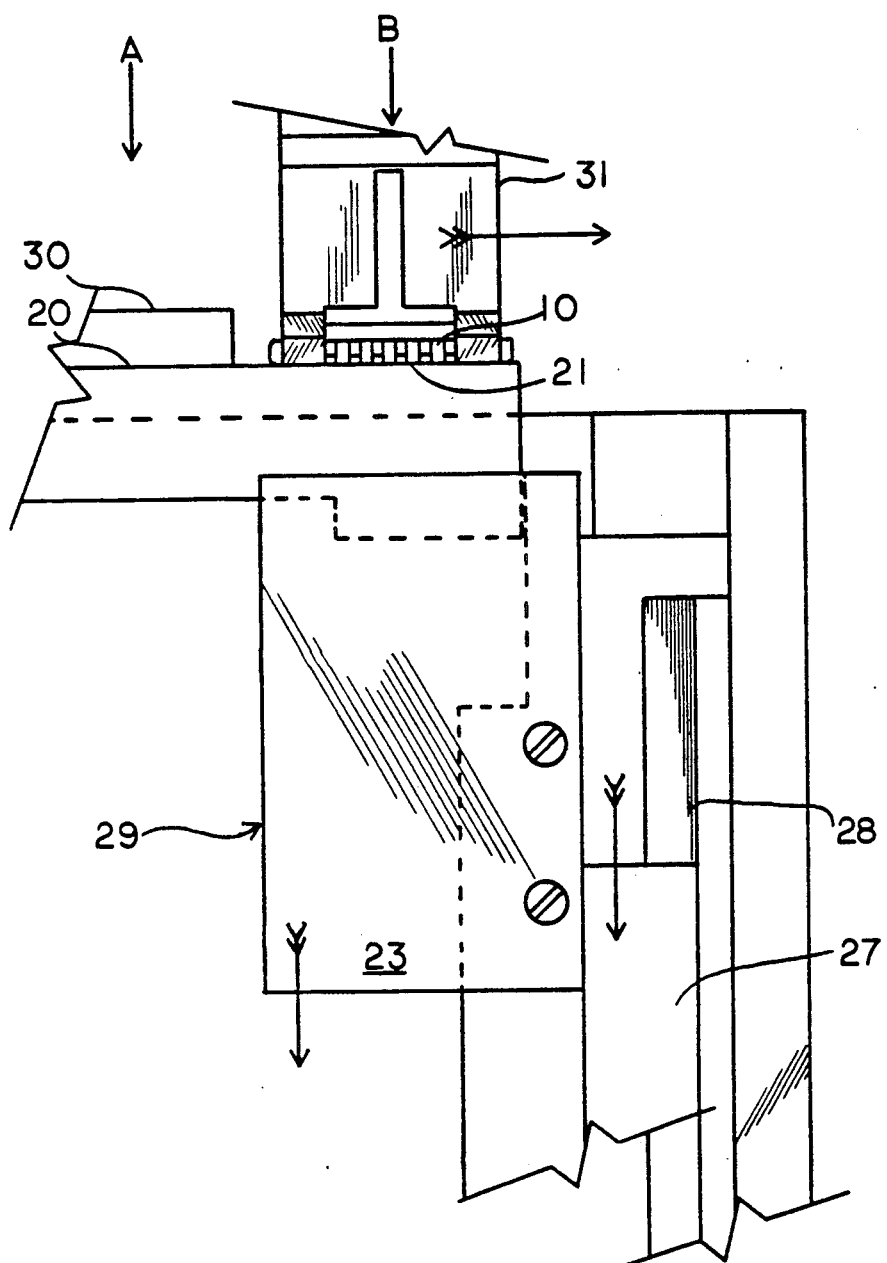
FIG. 3 shows a side view of the preferred embodiment in a retracted position.

As indicated in FIGS. 2a and 3, when sensor 24 detects component 10 on staging platform 21, slide guide 29 is retracted by cylinder 25. Gripper 31 passing overhead closes on component 10, picking it up for subsequent lead tinning. Gripper 31 is open at position A, and is closed at position B, precisely over component 10. Gripper 31 remains closed on component 10 until component 10 is ready for release, presumably after tinning.

The resulting absence of component 10 from staging platform 21 causes sensor 24 to indicate extension of slide guide 29, to be ready to receive another component. If gripper 31 passes overhead while slide guide 29 is extended and waiting for a component, gripper 31 will be prevented from closing at position B. The opposing sides of gripper 31 are configured far enough apart when open to pass outside of restraints 23.

Figure 4A:
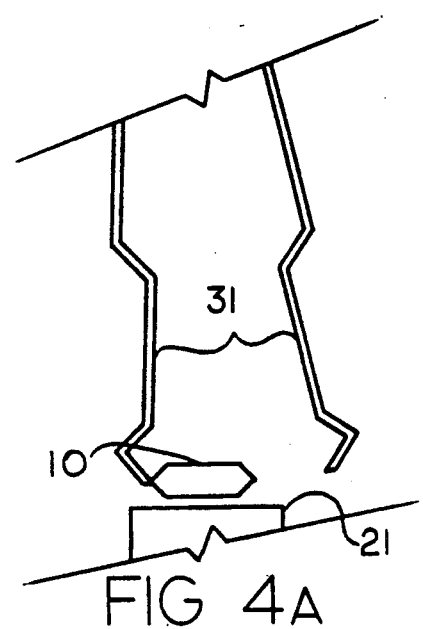
FIGS. 4a and 4b are end views, detailing an open and closed gripper, respectively, in relation to a component.
Figure 4B:
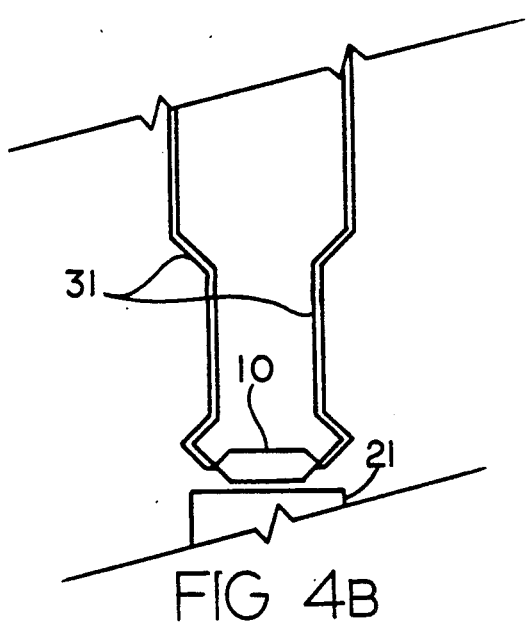

FIGS. 4a and 4b detail an end view of gripper 31 in relation to the body of component 10, in open and closed positions, respectively. Component 10 leads are not shown to improve clarity of the figures.

The resulting combination as disclosed virtually eliminates staging misalignment and dropping of components, allowing consistent, accurate pickup of a component for tinning.

Clearly, this configuration can be put to use for components other than PLCCs. This apparatus is adaptable to any lead tinning system having similar staging as the disclosed Corfin PLCC Lead Tinning System.

We claim:

1. A reciprocating staging fixture, to stage an electronic component in a lead tinning system for pickup by a gripper moved by a conveyor, comprising:
   a staging platform, having means to sense when a component enters a staging area on said staging platform;
   a slide guide, having a slide guide end restraint and two opposing side restraints, configured to surround said staging area on three sides;
   means to reciprocate said slide guide relative to said staging platform, so that said slide guide when extended may receive and stage a component in said staging area, and so that said slide guide when retracted will not interfere with the gripper closing on a component in said staging area;
   said sensing means operable so that:
   when no component is sensed by said sensing means, said slide guide is extended by said reciprocating means to surround said staging area in readiness to receive a component, and the gripper is prevented from closing as it passes near said staging area; and
   when a component enters said staging area and is sensed by said sensing means, the component is stopped by said slide guide end restraint and is kept in alignment by said two side restraints, and then said slide guide is retracted away from said staging area by said reciprocating means, so that the component may be closed upon by the gripper as it passes near said staging area.

2. The reciprocating staging fixture of claim 1, wherein said reciprocating means vertically reciprocates said slide guide relative to said staging platform.

3. The reciprocating staging fixture of claim 1, wherein said slide guide is configured with respect to the gripper so that said slide guide and the gripper when open will not contact.

4. The reciprocating staging fixture of claim 1, including a slide input whereby a component enters said staging area.

5. A reciprocating staging fixture, to stage an electronic component in a lead tinning system for pickup by a gripper moved by a conveyor, comprising:
   a staging platform, having means to sense when a component enters a staging area on said staging platform;
   a slide input, to input a component into said staging area;
   a slide guide, having a slide guide end restraint and two opposing side restraints, configured to surround said staging area on three sides, configured with respect to the gripper so that said slide guide and the gripper will not contact when said slide guide is extended and the gripper is open;
   means to vertically reciprocate said slide guide relative to said staging platform, so that said slide guide when extended may receive and stage a component in said staging area, and so that said slide guide when retracted will not interfere with the gripper closing on a component in said staging area;
   said sensing means operable so that:
   when no component is sensed by said sensing means, said slide guide is extended by said reciprocating means to surround said staging area in readiness to receive a component, and the gripper is prevented from closing as it passes near said staging area; and
   when a component enters said staging area and is sensed by said sensing means, the component is stopped by said slide guide end restraint and is kept in alignment by said two side restraints, and then said slide guide is retracted away from said staging area by said reciprocating means, so that the component may be closed upon by the gripper as it passes near said staging area.

* * * * *